(12) United States Patent
Chang et al.

(10) Patent No.: US 7,345,909 B2
(45) Date of Patent: Mar. 18, 2008

(54) LOW-POWER SRAM MEMORY CELL

(76) Inventors: Yen-Jen Chang, No. 276, Sec. 2, Yuan-Chi Rd., Yuan-Lin Chen, Chang-Hua Hsien (TW); Feipei Lai, No. 57, Wen-Chou St., Taipei City (TW); Chia-Lin Yang, No. 1, Sec. 4, Roosevelt Rd., Taipei City (TW)

(\*) Notice: Subject to any disclaimer, the term of this patent is extended or adjusted under 35 U.S.C. 154(b) by 463 days.

(21) Appl. No.: 10/947,894

(22) Filed: Sep. 23, 2004

(65) Prior Publication Data
US 2007/0297249 A1 Dec. 27, 2007

Related U.S. Application Data

(60) Provisional application No. 60/603,980, filed on Aug. 24, 2004.

(30) Foreign Application Priority Data
Sep. 24, 2003 (TW) .............................. 92126407 A

(51) Int. Cl.
*G11C 11/40* (2006.01)
(52) U.S. Cl. ........................ 365/154; 365/156; 365/190
(58) Field of Classification Search ................. 365/156
See application file for complete search history.

(56) References Cited

U.S. PATENT DOCUMENTS

| | | | | | |
|---|---|---|---|---|---|
| 5,469,380 | A | * | 11/1995 | Iio | 365/154 |
| 5,847,990 | A | * | 12/1998 | Irrinki et al. | 365/154 |
| 5,959,931 | A | * | 9/1999 | Ueda | 365/230.05 |
| 6,055,177 | A | * | 4/2000 | Narayana et al. | 365/154 |
| 6,061,268 | A | * | 5/2000 | Kuo et al. | 365/156 |
| 6,091,626 | A | * | 7/2000 | Madan | 365/154 |
| 6,711,086 | B2 | * | 3/2004 | Terada | 365/230.05 |
| 2007/0041239 | A1 | * | 2/2007 | Takeda | 365/154 |

FOREIGN PATENT DOCUMENTS

JP         41100775 A   *   1/1999

\* cited by examiner

*Primary Examiner*—Tan T. Nguyen
(74) *Attorney, Agent, or Firm*—The Webb Law Firm

(57) ABSTRACT

An SRAM memory cell that has a relatively small power consumption when writing a write value of '0' to the memory cell includes cross-coupled first and second inverters, at least one read access transistor for selectively coupling a respective read bit line to a common connection node of a respective one of the first and second inverters, a switching transistor for selectively coupling the second inverter to a ground terminal, and a write access transistor for selectively coupling the common connection node of the second inverter to a write bit line.

12 Claims, 3 Drawing Sheets

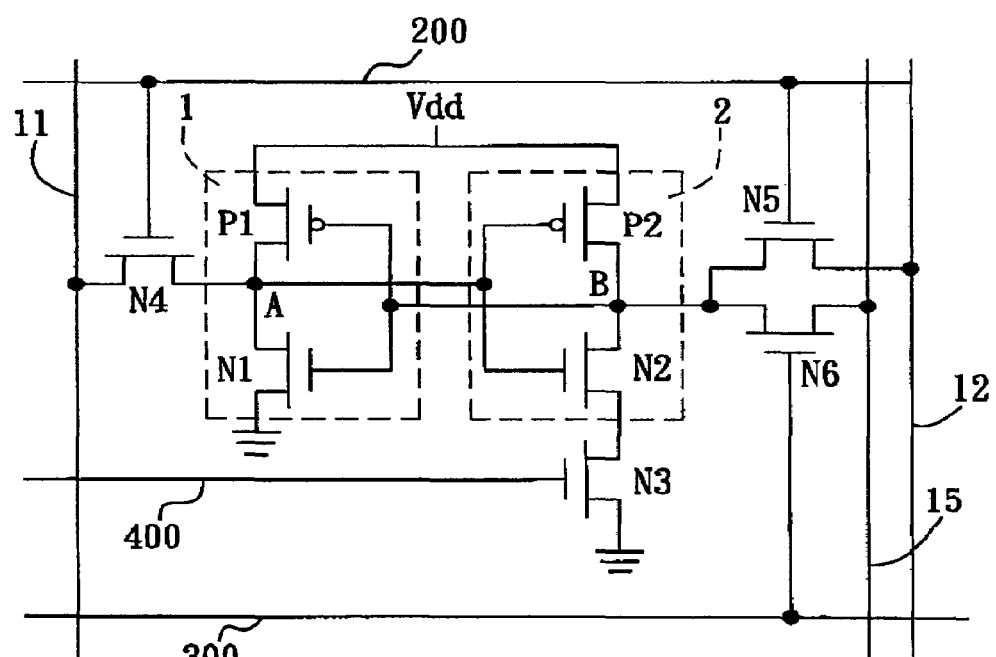
F I G. 2

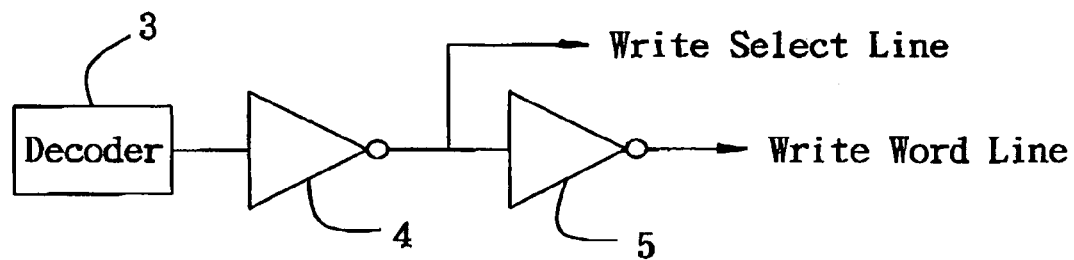
F I G. 3
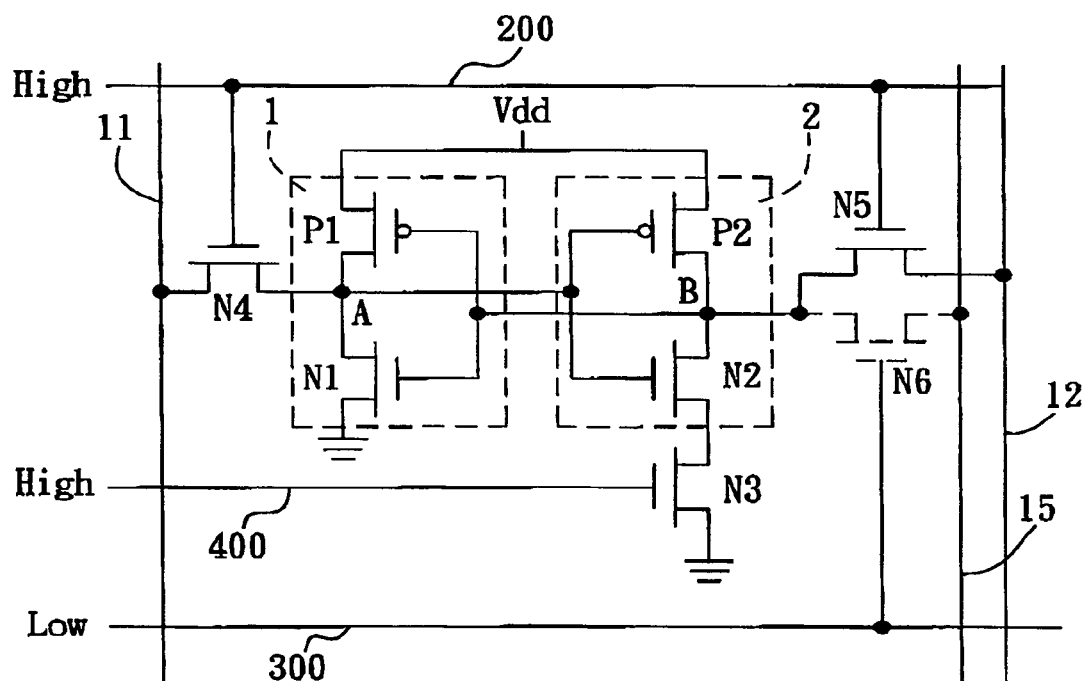
F I G. 4

LOW-POWER SRAM MEMORY CELL

CROSS-REFERENCE TO RELATED APPLICATIONS

This application claims priority of Taiwanese application no. 092126407, filed on Sep. 24, 2003, and U.S. provisional patent application No. 60/603,980, filed on Aug. 24, 2004.

BACKGROUND OF THE INVENTION

1. Field of the Invention

The invention relates to a semiconductor memory cell, more particularly to an SRAM memory cell that consumes a relatively small amount of power when writing a write value of '0' to the memory cell.

2. Description of the Related Art

Random access memories (RAM) can be classified into dynamic random access memories (DRAM) and static random access memories (SRAM), the latter being commonly employed in cache memories in view of their fast access times.

FIG. 1 illustrates a conventional SRAM memory cell that has a write port and a read port, and that is formed from eight transistors (T1-T8). The transistors (T1, T2) are PMOS field effect transistors, whereas the transistors (T3, T4) are NMOS field effect transistors. The transistors (T1, T3) are coupled in series to form a CMOS inverter 10. The transistors (T2, T4) are likewise coupled in series to form another CMOS inverter 20.

Each of the inverters 10, 20 is coupled between a power terminal (Vdd) and a ground terminal. The inverters 10, 20 are cross-coupled. That is, the transistors (T2, T4) of the inverter 20 have gate terminals that are coupled to a common connection node (D1) of the transistors (T1, T3) of the inverter 10, whereas the transistors (T1, T3) of the inverter 10 have gate terminals that are coupled to a common connection node (D2) of the transistors (T2, T4) of the inverter 20. The logic states at the nodes (D1, D2) indicate the logic state of the data bit stored in the memory cell.

The other transistors (T5-T8) of the memory cell act as access transistors. In particular, the transistors (T5, T6) are used for writing data, whereas the transistors (T7, T8) are used for reading data. Since state changes of these two transistor sets during read and write operations are analogous, only the activities of the transistors (T5, T6) during a write operation will be discussed in detail hereinafter.

Each of the transistors (T5, T6) is coupled to one of the nodes (D1, D2) at one end, and to a positive bit line (C1) or a negative bit line (C2) at another end. A word line (W) is coupled to the gate terminals of the transistors (T5, T6), and is responsible for controlling turn on and turn off activities of the transistors (T5, T6), thereby controlling writing of bit data through the positive or negative bit line (C1, C2).

In order to achieve fast access times, each of the bit lines (C1-C4) is pre-charged to a high logic state when there is no write or read activity. During a write operation, for example, when the write value is '1', the positive bit line (C1) is maintained at the high logic state (i.e., Vdd), whereas the negative bit line (C2) is discharged to a low logic state. Accordingly, when the word line (w) is at the high logic state, the transistors (T5, T6) are turned on, thus turning off the transistor (T3) and turning on the transistor (T4). As a result, the node (D1) is at the high logic state, and the node (D2) is at the low logic state. This indicates that the data bit '1' has been written to the memory cell. At the end of the write operation, the positive and negative bit lines (C1, C2) are once again pre-charged to the high logic state. In the same manner, when the write value is '0', the positive bit line (C1) is at the low logic state, whereas the negative bit line (C2) is at the high logic state.

During a read operation, for example, when the read value is '1', when the word line (R) is at the high logic state after pre-charging the positive and negative bit lines (C3, C4) to the high logic state, the transistors (T7, T8) are turned on. Since the transistor (T4) is also turned on and is grounded, the negative bit line (C4) will discharge via the transistor (T4), thereby resulting in a voltage difference between the positive and negative bit lines (C3, C4). Through the detection of a peripheral circuit (not shown), the data bit '1' can be read accordingly.

During the write operation, regardless of whether the write value is '0' or '1', the logic state of one of the bit lines (C1, C2) is required to change from high to low (i.e., the logic states of the positive and negative bit lines must be opposite to each other). However, during pre-charging, the positive and negative bit lines (C1, C2) are both pulled to the high logic state. As a result, a substantial amount of power is wasted. This situation is evident when a current write value is different from that written beforehand, such as when a stored write value '0' is to be overwritten by '1', or when a stored write value '1' is to be overwritten by '0'. In this instance, a full voltage swing occurs to ensure the required logic states at the nodes (D1, D2), which results in substantial power consumption.

In order to reduce power consumption, it has been proposed heretofore to use only half of the voltage swing amplitude when changing the bit line voltage. The proposed scheme, however, results in instability of the memory cell.

In U.S. Pat. No. 6,212,094, there is disclosed a low-power SRAM memory cell formed from five transistors and having one bit line and one word line for reading and writing data. Since there is only one bit line, power consumption is less than that of the conventional SRAM memory cell of FIG. 1. However, the asymmetric design of the proposed SRAM memory cell is directed to reducing power consumption when writing a write value '1' to the memory cell.

In practice, upon examining instructions or data accessed from a cache memory, the number of '0' bits is actually greater than the number of '1' bits. In an actual test conducted using the SPEC2000 benchmarks, the proportion of '0' bits to the total data can exceed 80%. Hence, there is a pressing need for an improved SRAM memory cell that can reduce power consumption when writing a write value of '0'.

SUMMARY OF THE INVENTION

Therefore, the object of the present invention is to provide an SRAM memory cell that consumes a relatively small amount of power when writing a write value of '0' to the memory cell.

According to one aspect of the invention, a semiconductor memory cell comprises:

a first inverter including a pair of CMOS field effect transistors that are coupled in series, that respectively have gate terminals, and that further have a first common connection node, the first inverter being adapted to be coupled between a power terminal and a ground terminal;

a second inverter including a pull-up transistor adapted to be coupled to the power terminal, and a pull-down transistor coupled in series to the pull-up transistor, the pull-up and pull-down transistors having a second common connection node coupled to the gate terminals of the field effect transistors, and respectively having gate terminals coupled to the first common connection node;

first and second read bit lines;

first and second read access transistors, each of which selectively couples a respective one of the first and second read bit lines to a respective one of the first and second common connection nodes;

a read word line coupled to the first and second read access transistors to control turn on and turn off activities of the first and second read access transistors;

a switching transistor for selectively coupling the second inverter to the ground terminal;

a write bit line;

a write access transistor for selectively coupling the second common connection node to the write bit line; and a write word line coupled to the write access transistor to control turn on and turn off activities of the write access transistor.

According to another aspect of the invention, there is provided a method of writing data to a semiconductor memory cell. The semiconductor memory cell includes cross-coupled first and second inverters, each of which has a pull-up transistor and a pull-down transistor that is coupled in series to the pull-up transistor. The pull-up and pull-down transistors of each of the first and second inverters are coupled between a power terminal and a ground terminal. The first and second inverters respectively have first and second common connection nodes at junctions of the pull-up and pull-down transistors. The method comprises:

providing a write bit line to be coupled selectively to the second common connection node;

pre-charging the write bit line;

breaking electrical connection between the second inverter and the ground terminal; and without changing a logic state of the write bit line, making electrical connection between the write bit line and the second common connection node to write a data bit with a write value of '0' to the semiconductor memory cell.

According to a further aspect of the invention, a semiconductor memory cell comprises:

a first inverter including a pair of CMOS field effect transistors that are coupled in series, that respectively have gate terminals, and that further have a first common connection node, the first inverter being adapted to be coupled between a power terminal and a ground terminal;

a second inverter including a pull-up transistor adapted to be coupled to the power terminal, and a pull-down transistor coupled in series to the pull-up transistor, the pull-up and pull-down transistors having a second common connection node coupled to the gate terminals of the field effect transistors, and respectively having gate terminals coupled to the first common connection node;

a bit line;

read and write access transistors, each of which selectively couples the bit line to the second common connection node;

a read word line coupled to the read access transistor to control turn on and turn off activities of the read access transistor;

a write word line coupled to the write access transistor to control turn on and turn off activities of the write access transistor; and a switching transistor for selectively coupling the second inverter to the ground terminal.

BRIEF DESCRIPTION OF THE DRAWINGS

Other features and advantages of the present invention will become apparent in the following detailed description of the preferred embodiments with reference to the accompanying drawings, of which:

FIG. 2 is a schematic diagram of the first preferred embodiment of a low-power SRAM memory cell according to this invention;

FIG. 3 is a schematic diagram to illustrate how a write select signal and a write word line signal are generated in the first preferred embodiment;

FIG. 4 is a schematic diagram similar to FIG. 2, illustrating a read operation of the first preferred embodiment;

DETAILED DESCRIPTION OF THE PREFERRED EMBODIMENTS

Figure 1:
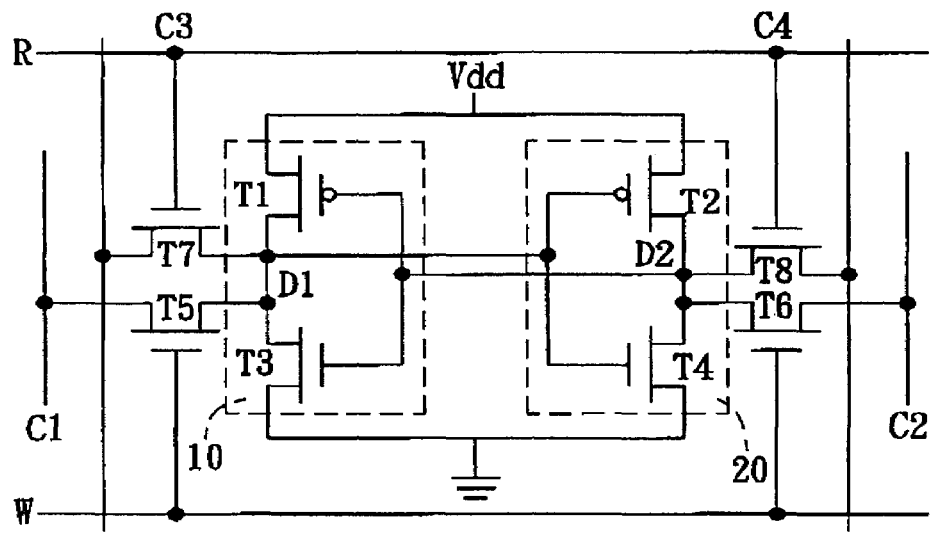
FIG. 1 is a schematic diagram of a conventional SRAM memory cell.

Before the present invention is described in greater detail, it should be noted that like elements are denoted by the same reference numerals throughout the disclosure.

Referring to FIG. 2, the first preferred embodiment of a low-power SRAM memory cell according to this invention is shown to comprise a first inverter 1, a second inverter 2, a switching transistor (N3), two read access transistors (N4, N5), and a write access transistor (N6).

The first inverter 1 includes a pair of transistors (P1, N1) that are coupled in series. The second inverter 2 likewise includes a pair of transistors (P2, N2) that are coupled in series. The transistors (P1, P2) are PMOS field effect transistors, whereas the transistors (N1, N2) are NMOS field effect transistors. The first and second inverters 1, 2 are cross-coupled. That is, the transistors (P2, N2) of the second inverter 2 have gate terminals that are coupled to a common connection node (A) of the transistors (P1, N1) of the first inverter 1, whereas the transistors (P1, N1) of the first inverter 1 have gate terminals that are coupled to a common connection node (B) of the transistors (P2, N2) of the second inverter 2.

Each of the transistors (P1, P2) has a source terminal coupled to a power terminal (Vdd) and thus serves as a pull-up transistor. On the other hand, the transistor (N1) has a source terminal coupled to a ground terminal and thus serves as a pull-down transistor. In this embodiment, the transistor (N2) of the second inverter 2 is not coupled directly to the ground terminal, but is instead coupled indirectly to the ground terminal via the switching transistor (N3). The switching transistor (N3) has a gate terminal coupled to a write select line 400.

The read access transistors (N4, N5) operate in a manner similar to the transistors (T5, T6) of the conventional SRAM memory cell of FIG. 1. The read access transistors (N4, N5) are used to control reading of data from the memory cell, and writing of data to the memory cell is not done through the read access transistors (N4, N5). The read access transistor (N4) has one end coupled to the common connection node (A) and another end coupled to a first read bit line 11. In a similar manner, the read access transistor (N5) has one end coupled to the common connection node (B), and another end coupled to a second read bit line 12. The read access transistors (N4, N5) further have gate terminals that are coupled to a read word line 200. Accordingly, depending on the logic state at the read word line 200, turn on and turn off activities of the read access transistors (N4, N5) are controlled to control in turn reading of data through selective coupling of the first and second bit lines 11, 12 to the common connection nodes (A, B).

The write access transistor (N6) has one end coupled to the common connection node (B) and another end coupled to a write bit line 15. The write access transistor (N6) further has a gate terminal coupled to a write word line 300. As a result, depending on the logic state at the write word line 300, the write access transistor (N6) can be turned on or turned off such that writing of data to the SRAM memory cell of this embodiment is conducted through selective coupling of the write bit line 15 to the common connection node (B).

FIG. 3 illustrates how a write select signal to be applied to the write select line 400 and a write word line signal to be applied to the write word line 300 are generated in the first preferred embodiment of this invention. It is noted that the logic states of the signals at the write word line 300 and the write select line 400 are opposite to each other, and the logic state transition at the write select line 400 occurs earlier than that at the write word line 300. In the preferred embodiment, the write word line signal generated by a decoder 3 is processed by an inverter 4 to result in the write select line signal that is provided to the write select line 400. The write select line signal is then processed by another inverter 5 to recover the write word line signal that is subsequently provided to the write word line 300.

A read operation is accomplished in the low-power SRAM memory cell of this invention through the control of the read word line 200, the read bit lines 11, 12, and the write select line 400. On the other hand, a write operation is accomplished in the low-power SRAM memory cell of this invention through the control of the write word line 300, the write bit line 15, and the write select line 400. The read and write operations of the low-power SRAM memory cell of this invention will now be described in greater detail in the succeeding paragraphs.

1. Read Mode

During the read operation, the write word line 300 is at the low logic state, and the write select line 400 is at the high logic state. As a result, the switching transistor (N3) is turned on, and the write access transistor (N6) is turned off. The equivalent circuit of the low-power SRAM memory cell during the read operation is shown in FIG. 4.

Since the write access transistor (N6) is turned off, the logic state at the write bit line 15 does not affect the read operation of the low-power SRAM memory cell. Moreover, since the switching transistor (N3) is turned on, the transistor (N2) is grounded via the switching transistor (N3). The resultant equivalent circuit of the low-power SRAM memory cell of this embodiment is thus similar to that of the conventional SRAM memory cell shown in FIG. 1. As a result, data stored in the low-power SRAM memory cell can be read through the read access transistors (N4, N5) that are coupled to the read bit lines 11, 12 and the common connection nodes (A, B). Since the read operation proceeds in a manner similar to that of the conventional SRAM memory cell, a detailed description of the same is omitted herein for the sake of brevity.

2. Write Mode

Figure 5:
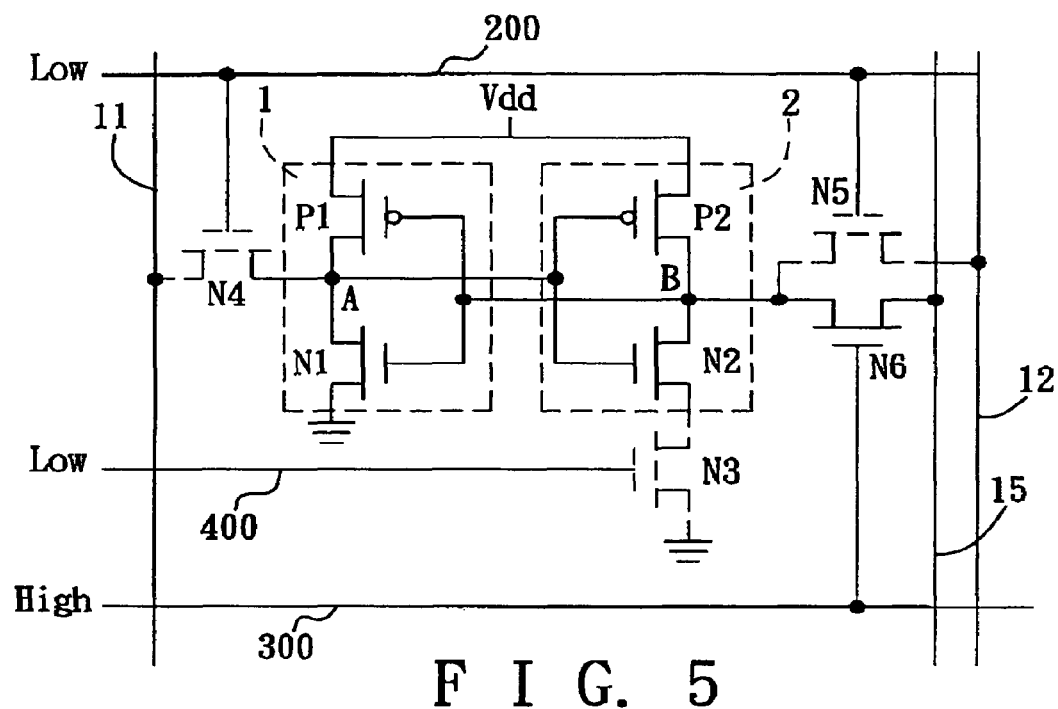
FIG. 5 is a schematic diagram similar to FIG. 2, illustrating a write operation of the first preferred embodiment.

With reference to FIG. 5, during the write operation, the read word line 200 is at the low logic state, thereby turning off the read access transistors (N4, N5). Moreover, the write word line 300 is at the high logic state, thereby turning on the write access transistor (N6) to permit writing of data to the low-power SRAM memory cell by making connection between the write bit line 15 and the common connection node (B). As described beforehand, before the write word line 300 changes to the high logic state, the write select line 400 has already changed to the low logic state. As a result, the switching transistor (N3) is turned off such that the source terminal of the transistor (N2) of the second inverter 2 is no longer grounded.

The write operation of the low-power SRAM memory cell of this embodiment depends on the data previously stored in the memory cell.

(a) Write Value is '1'

When the write value is '1', it is possible that the data previously stored in the low-power SRAM memory cell has a value of '1' or a value of '0'. In other words, when the write value is '1', the write operation may be one in which a previously stored value of '1' is overwritten with the write value of '1' (1→1), or a previously stored value of '0', is overwritten with the write value of '1' (0→1). Since the various transistors do not undergo any state change during the (1→1) write operation, only the (0→1) write operation will be described in detail hereinafter.

During the (0→1) write operation, in order to permit writing of the write value '1' to the low-power SRAM memory cell of this embodiment, the initial high logic state at the common connection node (B) must be pulled to the low logic state, and the initial low logic state at the common connection node (A) must be pulled to the high logic state. To this end, after pre-charging the write bit line 15, the write bit line 15 is pulled to the low logic state (i.e., about 0 volt). Thus, when the write access transistor (N6) is turned on, the common connection node (B) will be discharged to the low logic state, i.e., current flows through the transistor (P2), the common connection node (B) and the write bit line 15.

Since the common connection node (B) is at the low logic state, the gate terminals of the transistors (P1, N1) are also at the low logic state. As a result, the transistor (N1) is turned off, whereas the transistor (P1) is turned on. Accordingly, the common connection node (A) is at the high logic state, thereby writing the write value '1' to the low-power SRAM memory cell.

(b) Write Value is '0'

When the write value is '0', it is likewise possible that the data previously stored in the low-power SRAM memory cell has a value of '1' or a value of '0'. In other words, when the write value is '0', the write operation may be one in which a previously stored value of '0' is overwritten with the write value of '0' (0→0), or a previously stored value of '1' is overwritten with the write value of '0' (1→0). Since the various transistors do not undergo any state change during the (0→0) write operation, only the (1→0) write operation will be described in detail hereinafter.

During the (1→0) write operation, in order to permit writing of the write value '0' to the low-power SRAM memory cell of this embodiment, the initial low logic state at the common connection node (B) must be pulled to the high logic state, and the initial high logic state at the common connection node (A) must be pulled to the low logic state. To this end, after pre-charging the write bit line 15, the write bit line 15 is maintained at the high logic state. Thus, when the write access transistor (N6) is turned on, the common connection node (B) will be charged;

It is evident from the aforesaid that, when writing the write value of '0' to the low-power SRAM memory cell of this embodiment, there is no need to change the logic state at the write bit line 15, i.e., the write bit line 15 is maintained at the pre-charged high logic state. As a result, the power consumed during the write '0' operation can be reduced considerably as compared to the prior art. In particular, when the write access transistor (N6) is turned on, although the common connection node (B) is initially at the low logic state, since the switching transistor (N3) is turned off during the write '0' operation, the ground connection of the common connection node (B) is cut-off. As a result, the common connection node (B) can be easily pulled to the high logic state. Therefore, after the write '0' operation, the voltage amplitude swing during pre-charging of the write bit line 15 is reduced to reduce power consumption during the write '0' operation accordingly.

Since the common connection node (B) is at the high logic state, the gate terminals of the transistors (P1, N1) are also at the high logic state. As a result, the transistor (N1) is turned on, whereas the transistor (P1) is turned off. Accordingly, the common connection node (A) is at the low logic state, thereby writing the write value of '0' to the low-power SRAM memory cell.

The following table shows results of an experiment conducted to compare the power consumptions of the low-power SRAM memory cell according to the first preferred embodiment and the conventional SRAM memory cell shown in FIG. 1 for various write patterns. In the experiment, which was conducted using TSMC 0.35 µm fabrication technology, a basic unit includes one row of interconnected memory cells. The results were obtained via HSPICE computer simulation.

| Write Pattern | Power Consumption (Prior Art) | Power Consumption (Present Invention) | Reduction in Power Consumption |
|---|---|---|---|
| (1 → 0) | 4.65E−01 | 1.30E−02 | 97.21% |
| (0 → 0) | 4.37E−01 | 5.17E−03 | 98.82% |
| (1 → 1) | 4.35E−01 | 4.20E−01 | 3.50% |
| (0 → 0) | 4.92E−01 | 4.64−01 | 5.70% |

It is evident from the aforesaid results that the reduction in power consumption is not significant when the write value is '1'. However, when the write value is '0', due to the breaking of the ground connection by turning off the switching transistor (N3), and since there is hardly a change in the logic state of the write bit line 15, the reduction in power consumption can reach as high as 97% for the low-power SRAM memory cell of this invention as compared to the conventional SRAM memory cell described beforehand.

Since the low-power SAM memory cell of this invention has an asymmetric circuit design, the stability (i.e., static noise margin) of the low-power SRAM memory cell could be inferior to that of the conventional SRAM memory cell of FIG. 1. However, it is possible to compensate such a drawback by adjusting process parameters, such as the width/length ratio (W/L ratio) of the transistors (N2, N3), while maintaining the objective of achieving low power consumption when the write value is '0'.

Figure 6:
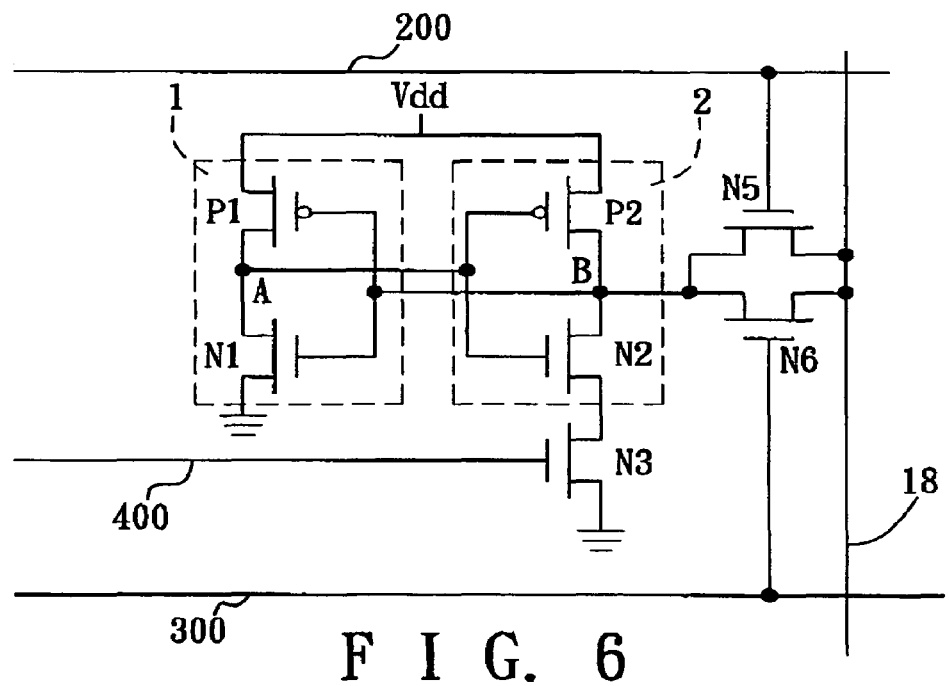
FIG. 6 is a schematic diagram of the second preferred embodiment of a low-power SRAM memory cell according to this invention.

The second preferred embodiment of a low-power SRAM memory cell according to the present invention is shown in FIG. 6. The low-power SRAM memory cell of this embodiment differs from the previous embodiment in terms of the following: The low-power SRAM memory cell of the first preferred embodiment has separate read and write ports. That is, read and write operations are accomplished through different bit lines. In contrast, the low-power SRAM memory cell of the second preferred embodiment has a read/write port. That is, read and write operations are accomplished through the same bit line 18.

Therefore, the circuit of the second preferred embodiment differs from that of the first preferred embodiment in the use of a single bit line 18 and a single read access transistor (N5). Each of the read access transistor (N5) and the write access transistor (N6) couples selectively the bit line 18 to the common connection node (B) of the second inverter 2.

The read and write operations of the low-power SRAM memory cell of this embodiment will now be described in the following paragraphs.

1. Read Mode

During the read operation, the write word line 300 is at the low logic state, and the write select line 400 is at the high logic state. As a result, the switching transistor (N3) is turned on, thus grounding the second inverter 2. When the read word line 200 is at the high logic state, the read access transistor (N5) is turned on, and data stored in the low-power SRAM memory cell can be read in a manner similar to the first preferred embodiment through the common connection node (B) and the bit line 18.

In particular, when the data bit to be read is '0', since the bit line 18 has been pre-charged to the high logic state, and since the common connection node (B) is at the high logic state, the high logic state of the bit line 18 will be maintained. On the other hand, when the data bit to be read is '1', since the common connection node (B) is at the low logic state, the pre-charged bit line 18 will discharge via the transistors (N2, N3). Due to the change in the logic state of the bit line 18, a peripheral circuit (not shown) is able to detect the data bit '1' stored in the low-power SRAM memory cell.

2. Write Mode

Like the write operation of the first preferred embodiment, there is no need to change the logic state of the bit line 18 when the write value is '0'. In addition, since the switching transistor (N3) is turned off, the power consumed when the write value is '0' is considerably reduced as compared to the prior art.

It has thus been shown that, in the low-power SRAM memory cell with an asymmetric design according to this invention, since there is no need to change the logic state of the write bit line when writing a write value of '0' to the memory cell, power consumption is reduced. Furthermore, due to the switching transistor (N3), the common connection node (B) can be easily pulled to the high logic state, thereby reducing the voltage amplitude swing to effectively reduce the power consumption of the SRAM memory cell of this invention.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A semiconductor memory cell comprising:
   a first inverter including a pair of CMOS field effect transistors that are coupled in series, that respectively have gate terminals, and that further have a first common connection node, said first inverter being adapted to be coupled between a power terminal and a ground terminal;

a second inverter including a pull-up transistor adapted to be coupled to the power terminal, and a pull-down transistor coupled in series to said pull-up transistor, said pull-up and pull-down transistors having a second common connection node coupled to said gate terminals of said field effect transistors, and respectively having gate terminals coupled to said first common connection node;

first and second read bit lines;

first and second read access transistors, each of which selectively couples a respective one of said first and second read bit lines to a respective one of said first and second common connection nodes;

a read word line coupled to said first and second read access transistors to control turn on and turn off activities of said first and second read access transistors;

a switching transistor for selectively coupling said second inverter to the ground terminal;

a write bit line;

a write access transistor for selectively coupling said second common connection node to said write bit line; and a write word line coupled to said write access transistor to control turn on and turn off activities of said write access transistor.

2. The semiconductor memory cell as claimed in claim 1, wherein said switching transistor is adapted to couple selectively said pull-down transistor to the ground terminal.

3. The semiconductor memory cell as claimed in claim 1, further comprising a write select line coupled to said switching transistor to control turn on and turn off activities of said switching transistor.

4. The semiconductor memory cell as claimed in claim 3, further comprising:

means for generating a write select signal that is applied to said write select line, and a write word line signal that is applied to said write word line, said write select signal and said write word line signal having opposite logic states.

5. The semiconductor memory cell as claimed in claim 4, wherein, during a read operation, said write select line is at a high logic state to turn on said switching transistor and to couple said second inverter to the ground terminal, said write word line is at a low logic state to turn off said write access transistor, thereby disconnecting said second common connection node from said write bit line, and a data bit stored in said semiconductor memory cell is read through said first and second read access transistors and said first and second read bit lines.

6. The semiconductor memory cell as claimed in claim 4, wherein, during a write operation, said read word line is at the low logic state to turn off said first and second read access transistors, said switching transistor is turned off to break connection between said second inverter and the ground terminal, and said write word line is at the high logic state to turn on said write access transistor, thereby making connection between said write bit line and said second common connection node so that a data bit at said write bit line is stored in said semiconductor memory cell through said second common connection node.

7. The semiconductor memory cell as claimed in claim 6, wherein said write bit line is at the low logic state when writing a write value of '1' into said semiconductor memory cell.

8. The semiconductor memory cell as claimed in claim 6, wherein said write bit line is at the high logic state when writing a write value of '0' into said semiconductor memory cell.

9. A method of writing data to a semiconductor memory cell, the semiconductor memory cell including cross-coupled first and second inverters, each of the first and second inverters having a pull-up transistor and a pull-down transistor that is coupled in series to the pull-up transistor, the pull-up and pull-down transistors of each of the first and second inverters being coupled between a power terminal and a ground terminal, the first and second inverters respectively having first and second common connection nodes at junctions of the pull-up and pull-down transistors, said method comprising:

a) providing a write bit line to be coupled selectively to the second common connection node;

b) pre-charging the write bit line;

c) breaking electrical connection between the second inverter and the ground terminal; and d) without changing a logic state of the write bit line, making electrical connection between the write bit line and the second common connection node to write a data bit with a write value of '0' to the semiconductor memory cell.

10. The method as claimed in claim 9, wherein, in step a), a write access transistor is provided to couple selectively the write bit line to the second common connection node, the write bit line being connected to the second common connection node when the write access transistor is turned on.

11. The method as claimed in claim 9, wherein, in step c), a switching transistor is provided to couple selectively the pull-down transistor of the second inverter to the ground terminal, the switching transistor being turned off to break electrical connection between the second inverter and the ground terminal.

12. A semiconductor memory cell comprising:

a first inverter including a pair of CMOS field effect transistors that are coupled in series, that respectively have gate terminals, and that further have a first common connection node, said first inverter being adapted to be coupled between a power terminal and a ground terminal;

a second inverter including a pull-up transistor adapted to be coupled to the power terminal, and a pull-down transistor coupled in series to said pull-up transistor, said pull-up and pull-down transistors having a second common connection node coupled to said gate terminals of said field effect transistors, and respectively having gate terminals coupled to said first common connection node;

a bit line;

read and write access transistors, each of which selectively couples said bit line to said second common connection node;

a read word line coupled to said read access transistor to control turn on and turn off activities of said read access transistor;

a write word line coupled to said write access transistor to control turn on and turn off activities of said write access transistor; and a switching transistor for selectively coupling said second inverter to the ground terminal.

* * * * *